US009762822B2

(12) United States Patent
Negoro et al.

(10) Patent No.: US 9,762,822 B2
(45) Date of Patent: Sep. 12, 2017

(54) IMAGING DEVICE INCLUDING A PHOTOTRANSISTOR, METHOD OF DRIVING THE IMAGING DEVICE, AND CAMERA INCLUDING THE IMAGING DEVICE

(71) Applicants: Takaaki Negoro, Kishiwada (JP); Hirofumi Watanabe, Miki (JP); Katsuhiko Aisu, Takarazuka (JP); Kazuhiro Yoneda, Osaka (JP); Katsuyuki Sakurano, Kobe (JP)

(72) Inventors: Takaaki Negoro, Kishiwada (JP); Hirofumi Watanabe, Miki (JP); Katsuhiko Aisu, Takarazuka (JP); Kazuhiro Yoneda, Osaka (JP); Katsuyuki Sakurano, Kobe (JP)

(73) Assignee: RICOH COMPANY, LTD., Tokyo (JP)

( * ) Notice: Subject to any disclaimer, the term of this patent is extended or adjusted under 35 U.S.C. 154(b) by 152 days.

(21) Appl. No.: 14/463,743

(22) Filed: Aug. 20, 2014

(65) Prior Publication Data

US 2015/0070546 A1    Mar. 12, 2015

(30) Foreign Application Priority Data

Sep. 10, 2013    (JP) ................... 2013-187663

(51) Int. Cl.
*H04N 5/355*    (2011.01)
*H01L 27/146*    (2006.01)
(Continued)

(52) U.S. Cl.
CPC ......... *H04N 5/3559* (2013.01); *H01L 27/148* (2013.01); *H01L 27/14612* (2013.01);
(Continued)

(58) Field of Classification Search
CPC .. H04N 5/3559; H04N 5/772; H04N 5/37457; H04N 5/378; H04N 5/35509;
(Continued)

(56) References Cited

U.S. PATENT DOCUMENTS 3,847,262 A * 11/1974 Higgins ............... B41J 3/51
400/104
RE34,309 E * 7/1993 Tanaka ............... H04N 3/1512
257/431
(Continued)

FOREIGN PATENT DOCUMENTS

JP    5-29644    2/1993
JP    5-236196    9/1993
(Continued)

OTHER PUBLICATIONS

U.S. Appl. No. 14/349,414, filed Apr. 3, 2014.
(Continued)

*Primary Examiner* — Hung Lam
(74) *Attorney, Agent, or Firm* — Cooper & Dunham LLP (57) ABSTRACT

An imaging device includes at least one pixel having a phototransistor which converts light energy into signal charge and varies an amplification factor relative to the intensity of the received light energy, wherein the signal charge of the phototransistor is read out while receiving the light energy with the phototransistor for each pixel.

18 Claims, 8 Drawing Sheets

(51) Int. Cl.
   *H04N 5/3745* (2011.01)
   *H04N 5/378* (2011.01)
   *H01L 27/148* (2006.01)
   *H04N 5/77* (2006.01)
   *H04N 5/374* (2011.01)
   *H04N 5/907* (2006.01)

(52) U.S. Cl.
   CPC .. *H01L 27/14638* (2013.01); *H01L 27/14681* (2013.01); *H04N 5/35509* (2013.01); *H04N 5/378* (2013.01); *H04N 5/3745* (2013.01); *H04N 5/37457* (2013.01); *H04N 5/772* (2013.01); *H04N 5/907* (2013.01)

(58) Field of Classification Search
   CPC .... H04N 5/3745; H04N 5/907; H01L 27/148; H01L 27/14638; H01L 27/14612; H01L 27/14681
   See application file for complete search history.

(56) References Cited

U.S. PATENT DOCUMENTS

| | | | |
|---|---|---|---|
| 6,307,586 B1* | 10/2001 | Costello | H04N 5/238 |
| | | | 250/214 VT |
| 7,525,472 B2* | 4/2009 | Kawae | H03M 1/52 |
| | | | 327/540 |
| 2002/0000508 A1 | 1/2002 | Muramatsu et al. | |
| 2002/0117711 A1* | 8/2002 | Yoneda | H01L 29/7813 |
| | | | 257/330 |
| 2002/0153474 A1 | 10/2002 | Muramatsu et al. | |
| 2003/0001206 A1 | 1/2003 | Negoro et al. | |
| 2003/0197552 A1 | 10/2003 | Watanabe | |
| 2003/0214336 A1 | 11/2003 | Watanabe | |
| 2004/0004992 A1 | 1/2004 | Aota et al. | |
| 2004/0175007 A1 | 9/2004 | Aisu | |
| 2004/0183119 A1 | 9/2004 | Negoro et al. | |
| 2004/0227183 A1 | 11/2004 | Negoro et al. | |
| 2005/0017297 A1 | 1/2005 | Shimizu et al. | |
| 2005/0052554 A1 | 3/2005 | Sakurai et al. | |
| 2005/0218478 A1 | 10/2005 | Watanabe | |
| 2006/0043520 A1* | 3/2006 | Jerdev | H01L 31/1126 |
| | | | 257/462 |
| 2006/0065949 A1 | 3/2006 | Kato et al. | |
| 2006/0076646 A1* | 4/2006 | Dang | H01L 31/1136 |
| | | | 257/462 |
| 2006/0138546 A1 | 6/2006 | Negoro et al. | |
| 2006/0152284 A1 | 7/2006 | Morino | |
| 2006/0197581 A1 | 9/2006 | Chun et al. | |
| 2007/0023517 A1 | 2/2007 | Tan et al. | |
| 2007/0047332 A1 | 3/2007 | Aota et al. | |
| 2007/0102638 A1 | 5/2007 | Watanabe | |
| 2007/0109039 A1 | 5/2007 | Watanabe | |
| 2007/0111557 A1 | 5/2007 | Higashiguchi et al. | |
| 2007/0188216 A1 | 8/2007 | Negoro | |
| 2007/0225560 A1* | 9/2007 | Avni | A61B 1/00006 |
| | | | 600/118 |
| 2008/0012543 A1 | 1/2008 | Negoro | |
| 2008/0100276 A1 | 5/2008 | Negoro | |
| 2009/0033420 A1 | 2/2009 | Negoro | |
| 2009/0064791 A1 | 3/2009 | Ueda et al. | |
| 2010/0201431 A1* | 8/2010 | Martin | H04N 5/37452 |
| | | | 327/514 |
| 2011/0012582 A1 | 1/2011 | Aisu | |
| 2011/0042745 A1 | 2/2011 | Negoro | |
| 2011/0155913 A1 | 6/2011 | Noguchi et al. | |
| 2011/0169570 A1 | 7/2011 | Aota et al. | |
| 2011/0181358 A1 | 7/2011 | Aisu | |
| 2011/0185326 A1 | 7/2011 | Ueda et al. | |
| 2012/0013383 A1 | 1/2012 | Negoro et al. | |
| 2012/0032733 A1 | 2/2012 | Negoro | |
| 2012/0181430 A1 | 7/2012 | Noguchi et al. | |
| 2012/0182272 A1* | 7/2012 | Ooi | G06F 3/03545 |
| | | | 345/179 |
| 2013/0119240 A1 | 5/2013 | Hayashi et al. | |
| 2013/0127504 A1 | 5/2013 | Hayashi et al. | |
| 2013/0161526 A1 | 6/2013 | Tajima | |
| 2013/0187030 A1 | 7/2013 | Hayashi et al. | |
| 2013/0234277 A1 | 9/2013 | Negoro et al. | |
| 2013/0240716 A1 | 9/2013 | Hayashi et al. | |
| 2013/0284931 A1 | 10/2013 | Nagahisa et al. | |
| 2014/0008524 A1 | 1/2014 | Hayashi et al. | |
| 2014/0077058 A1* | 3/2014 | Sakano | H01L 27/14612 |
| | | | 250/208.1 |

FOREIGN PATENT DOCUMENTS

| | | |
|---|---|---|
| JP | 2001-268442 | 9/2001 |
| JP | 2003-134396 | 5/2003 |
| JP | 3558589 | 5/2004 |
| JP | 3592106 | 9/2004 |
| JP | 2013-187527 | 9/2013 |
| WO | WO2012/124760 A1 | 9/2012 |

OTHER PUBLICATIONS

Feb. 3, 2015 European search report in corresponding European Patent Application No. 14183244.4.

Japanese official action dated May 23, 2017 in connection with corresponding Japanese patent application No. 2013-187663.

* cited by examiner

IMAGING DEVICE INCLUDING A PHOTOTRANSISTOR, METHOD OF DRIVING THE IMAGING DEVICE, AND CAMERA INCLUDING THE IMAGING DEVICE

PRIORITY CLAIM

The present application is based on and claims priority from Japanese Patent Application No. 2013-187663, filed on Sep. 10, 2013, the disclosure of which is hereby incorporated by reference in its entirety.

BACKGROUND

Field of the Invention

The present invention relates to an imaging device including a phototransistor which outputs photocurrent in light irradiation, a method of driving the imaging device, and a camera including the imaging device.

Description of the Related Art

CMOS (Complementary Metal-Oxide-Semiconductor) image sensors have been developed as highly sensitive imaging devices capable of imaging in the dark. A CMOS image sensor having a wide dynamic range capable of imaging in the dark and light at the same time has also been developed. A photodiode which outputs an electric charge to a photon on a one-to-one basis has been used for such CMOS image sensors as a photoelectric conversion element. CMOS image sensors convert signal charge generated through light receiving into voltage by source-follower output. Since the photodiodes have low sensitivity, signal charge is accumulated in, for example, a junction capacitance of the photodiode except in a readout time, in order to increase the signal charge generated by light energy. A method of increasing readout signal charge by signal charge accumulation has been adopted, so as to achieve high sensitivity. Regarding wide dynamic range, a technique which can correspond to high illumination imaging with an accumulation operation by the following method has been developed (refer to Patent Literature 1 (JP3984814B), for example).

(1) A method of photographing several images by a global shutter method which adjusts an accumulation time, and synthesizing the images.

(2) A method of having several capacitances in addition to floating diffusion.

(3) A method of using a photodiode having a capacitance larger than that of a conventional photodiode.

As one example of the above methods. Patent Literature 1 discloses a technique which connects a small capacity floating diffusion on the side of high sensitivity and low illumination and a large capacity floating diffusion on the side of low sensitivity and high illumination to a photodiode, selects the output on the side of low illumination and the output on the side of high illumination in accordance with an image-loading mode, and outputs each output. A wide dynamic range is thereby obtained by reducing 1/f noise.

A technique using a phototransistor having an operation of amplifying photocurrent as a photoelectric conversion element has also been developed (refer to Patent Literature 2 (JP H05-236196A), for example). Patent Literature 2 discloses a method of reading out signal charge after transferring the signal charge accumulated in the phototransistor to a capacitance and/or a base of a bipolar transistor provided separately from the phototransistor because all of the signal charge accumulated in the phototransistor cannot be discharged in the readout time. The accumulated charge remaining in the phototransistor in the transferring period of the signal charge from the phototransistor is reset.

However, with the conventional accumulation method, when light energy is strong and/or an accumulation time is long, the electric charge amount to be generated is increased, so that the electric charge amount exceeds the electric charge amount, which can be accumulated in the capacitance of the photoelectric conversion element, resulting in saturation. It becomes difficult to obtain a wide dynamic range. In order to solve this problem, it is necessary to increase the capacitance. It is also necessary to increase the area of the photoelectric conversion element, or to provide a capacitance which accumulates in another place for each pixel. For this reason, the size of an imaging device is increased. When a wide dynamic range is obtained by photographing and synthesizing a plurality of images with a change in irradiation time of light energy and/or accumulation time of signal charge, an operation of accumulating electric charge and a process speed at the time of synthesizing an image are required. For this reason, a circuit design is complicated in a data-processing portion, and an improvement in a device performance to be used is desired. Unfortunately, in the conventional technique, in order to obtain high sensitivity and a wide dynamic range, the circuit is complicated, and the size of the imaging device is increased.

SUMMARY

The present invention has been made in view of the above circumstances, and an object of the present invention is to provide an imaging device capable of achieving high sensitivity and a wide dynamic range with a simple circuit without increasing size, and a method of driving the imaging device.

To attain the above object, one embodiment of the present invention provides an imaging device including at least one pixel having a phototransistor which converts light energy into signal charge and varies an amplification factor relative to the intensity of the received light energy, wherein the signal charge of the phototransistor is read out while receiving the light energy with the phototransistor for each pixel.

BRIEF DESCRIPTION OF THE DRAWINGS

The accompanying drawings are included to provide further understanding of the invention, and are incorporated in and constitute a part of this specification. The drawings illustrate embodiments of the invention and, together with the specification, serve to explain the principle of the invention.

FIGS. 2A to 2C are views illustrating one example of a current amplification factor-variable phototransistor.

DETAILED DESCRIPTION OF THE PREFERRED EMBODIMENTS

An imaging device according to the present invention uses as a photoelectric conversion element a phototransistor including a function of amplifying photocurrent generated through receiving of light energy and an operation of varying a current amplification factor. Signal charge amplified by the phototransistor is read out as needed for each pixel while receiving light with the phototransistor.

(Embodiment 1)
(Configuration of Image Sensor)

Figure 1:
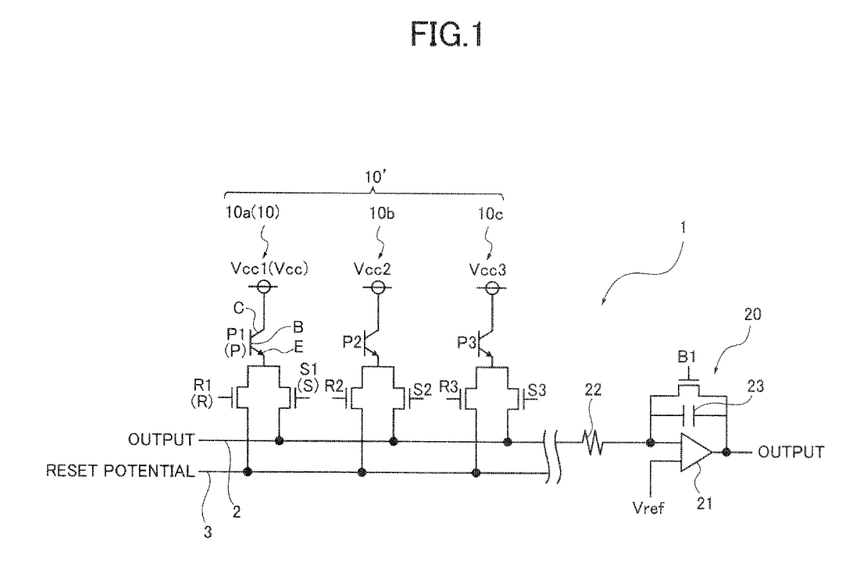
FIG. 1 is an equivalent circuit schematic of an image sensor (imaging device) according to Embodiment 1 of the present invention.

Hereinafter, one embodiment of the imaging device according to the present invention will be described with reference to the drawings. FIG. 1 is an equivalent circuit schematic of an image sensor 1 as an imaging device according to Embodiment 1 of the present invention. As illustrated in FIG. 1, the image sensor 1 according to Embodiment 1 includes a pixel array 10' having a plurality of pixels 10 (10a, 10b, 10c) arranged in an array, an integration amplifier 20 provided in the pixel array 10', an output line 2 as a signal charge readout path, and a reset line 3 as an alternative path provided separately from the output line 2. Only one pair (one line) of the pixel array 10' and the integration amplifier 20 is illustrated in FIG. 1. However, in Embodiment 1, plural pairs (plural lines) of the pixel array 10' and the integration amplifier 20 are disposed. The image sensor 1 in which the pixels 10 are two-dimensionally arranged in a matrix is thereby configured. The arrangement and the number of pixels 10 are not limited to Embodiment 1. An imaging device including only one pixel 10 and an imaging device including only one line of the pixel array 10' may be adopted, so that highly sensitive and wide dynamic range imaging device can be achieved.

Each pixel 10 (10a, 10b, 10c) includes a voltage source Vcc (Vcc1, Vcc2, Vcc3), a phototransistor P (P1, P2, P3), a selection switch S (S1, S2, S3) as a signal charge readout unit (first switch), and a reset switch R (R1, R2, R3) as an alternative path (second switch). In addition, in FIG. 1, an alphabetic letter is added to the end of reference numbers, for example, 10a, 10b, 10c, or a number is added to the end of alphabet letters, for example, P1, P2, P3, in order to easily distinguish each pixel 10 and a configuration component thereof. However, in the following description, an alphabetic letters or a numbers applied are omitted from the end.

The phototransistor P includes a vertical bipolar structure having an emitter region E, base region B, and collector region C, as illustrated in FIG. 1. The collector region C of the phototransistor P is connected to the voltage source Vcc. The connection of the emitter region E is switched by switching the selection switch S and the reset switch R. Namely, the emitter region E is connected to the output line 2 through the selection switch S by turning on the selection switch S and turning off the reset switch R. The integration amplifier 20 is connected to the output line 2, and the signal charge from the emitter region E is transferred to the integration amplifier 20. Moreover, the emitter region E is connected to the reset line 3 through the reset switch R by turning off the selection switch S and turning on the reset switch R. The accumulated charge inside the phototransistor P detours the output line 2 to be guided to the reset line 3, and is discharged. The selection switch S therefore operates as a readout unit of reading out signal charge of the phototransistor P. The reset switch R operates as a detour unit of detouring the accumulated charge inside the phototransistor P to the reset line 3 side to be discharged.

Hereinafter, timing of turning on and off the selection switch S and the reset switch R will be described. When reading out signal charge to be generated through receiving of light energy with the phototransistor P, the selection switch S is turned on and the reset switch R is turned off. The photocurrent output from the phototransistor P is thereby transferred to the integration amplifier 20 through the output line 2 as needed. In Embodiment 1, before reading out the signal charge from the phototransistor P by turning on the selection switch S, the accumulated charge inside the phototransistor P detours the output line 2 to be guided to the reset line 3 by using the reset switch R (detour process). Saturation inside the image sensor 1 is prevented by discharging the accumulated charge through the reset line 3.

In order to perform the detour process, the reset switch R is turned on over a time (hereinafter, referred to as a discharge time) preset at least for discharging in a state in which the selection switch S is turned off. In this case, after the elapse of 0 or more time after turning off the selection switch S, the reset switch R is turned on. With this operation, the phototransistor P is connected to the reset line 3, and the signal charge accumulated inside the phototransistor P detours the output line 2 to be guided to the reset line 3, and is discharged with a reset electric potential. The discharge time in which the reset switch R is turned on is set to a length sufficient for discharging the signal charge accumulated in the phototransistor P through the reset line 3.

After the detour process is completed, the receiving of the light energy with the phototransistor P is started, and the readout process of the converted signal charge is executed. In order to execute the readout process, the reset switch R is turned off and the selection switch S is turned on, so that the phototransistor P is connected to the output line 2. In this case, just after the reset switch R is turned off (for example, after several nanoseconds to 0.1 microsecond), the selection switch S is turned on. After the switching, the receiving of the light energy with the phototransistor P is started, and the accumulated signal charge is read out through the selection switch S as needed while receiving light with the phototransistor P. In addition, the time interval in the switching between the reset switch R and the selection switch S is not limited to the above. The switching time interval, more specifically, the discharge time can be freely set within a time of processing an image sent on a frame-to-frame basis in the case of a moving picture, for example.

The integration amplifier 20 is provided in the output line 2 from which the photocurrent is output. The integration amplifier 20 executes an integration process to the photocurrent read out from the phototransistor P, accumulates the photocurrent within a readout time, and converts the accumulated photocurrent into voltage to be output. The integration amplifier 20 includes an operational amplifier 21, resistor 22, capacitor 23, and integration amplifier reset switch B1. The integration amplifier reset switch B1 operates as an integration amplifier capacitance reset unit which discharges the signal charge accumulated in the capacitor 23 (reset process).

<Method of Driving Image Sensor>

Figure 6:
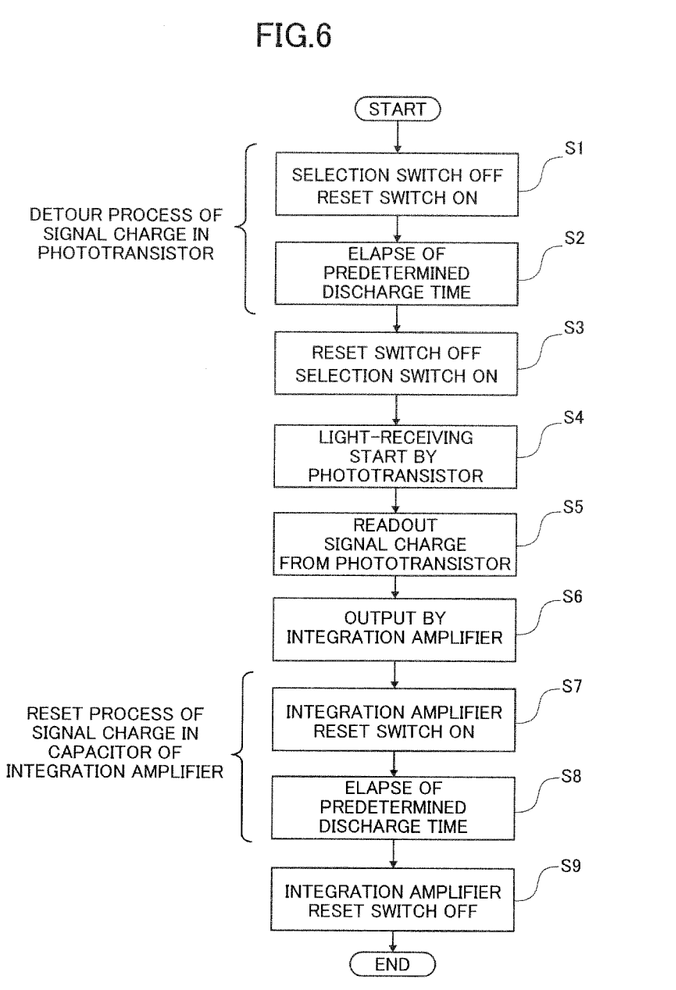
FIG. 6 is a flowchart illustrating an operation of a process of driving the image sensor according to Embodiment 1.

The operation of a process of driving (driving method) the image sensor 1 according to Embodiment 1 of the above configuration will be described with reference to the flowchart in FIG. 6. The image sensor 1 of Embodiment 1 executes the processes of Steps S1 to S9 illustrated in the flowchart of FIG. 6 in response to the receiving of a readout instruction (start instruction) of signal charge from a not-shown controller, for example. In the image sensor 1 of Embodiment 1, before reading out the signal charge from the phototransistor P, the detour process which detours the signal charge accumulated inside the phototransistor P to the reset line 3 side from the output line 2 to be discharged is executed. In order to execute the detour process, in each pixel 10, after the elapse of 0 or more time after turning off the selection switch S, the phototransistor P is connected to the reset line 3 by turning on the reset switch R (Step S1). The signal charge remaining inside the phototransistor P thereby detours the output line 2 to be guided to the reset line 3, and is discharged with a reset electric potential. The reset electric potential corresponds to reference voltage (Vert). By the detour process of the signal charge inside the phototransistor P, the saturation of the signal charge of the image sensor 1 can be controlled.

The discharge of the signal charge inside the phototransistor P is performed until the elapse of the preset discharge time (Step S2). The discharge time is set to a length sufficient for discharging the signal charge accumulated in the base region 52 of the phototransistor P through the reset line 3. After the elapse of the preset discharge time, the discharge is completed. Then, the reset switch R is turned off, and the selection switch S is turned on (step S3). In this case, just after turning off the reset switch R (after several nanoseconds to 0.1 microsecond, for example), the selection switch S is turned on.

As described above, following the detour process, the receiving of the light energy with the phototransistor P is started (Step S4) by turning off the reset switch R and turning on the selection switch S. By receiving the light energy, the light energy is amplified to be converted into signal charge with the phototransistor P. The signal charge amplified with the phototransistor P while receiving the light energy with the phototransistor P is read out as needed as the photocurrent by the selection switch S to be transferred to the integration amplifier 20 through the output line 2 (Step S5). In the integration amplifier 20, the photocurrent generated within the readout time is accumulated to be converted into voltage, and the converted voltage is output (Step S6). The signal output from the integration amplifier 20 is converted into a digital signal by a not-shown A/D convertor to be output from the image sensor 1.

Finally, the integration amplifier reset switch B1 of the integration amplifier 20 is turned on in order to execute the reset process of discharging the signal charge remaining in the capacitor 23 of the integration amplifier 20 (Step S7). The signal charge in the capacitor 23 can be thereby discharged. In this case, the discharging is performed until the elapse of a predetermined discharge time (step S8). After the elapse of the predetermined discharge time, the discharge is completed. Then, the integration amplifier reset switch B1 is turned off (Step S9). By this reset process, the saturation of the signal charge of the integration amplifier 20 is controlled, and the readout of the signal charge in the image sensor 1 can be preferably executed. The processes of Steps S1 to S9 are executed for each photographed still image or each frame of a moving picture.

<Configuration and Characteristic of Phototransistor>

Figure 2A:
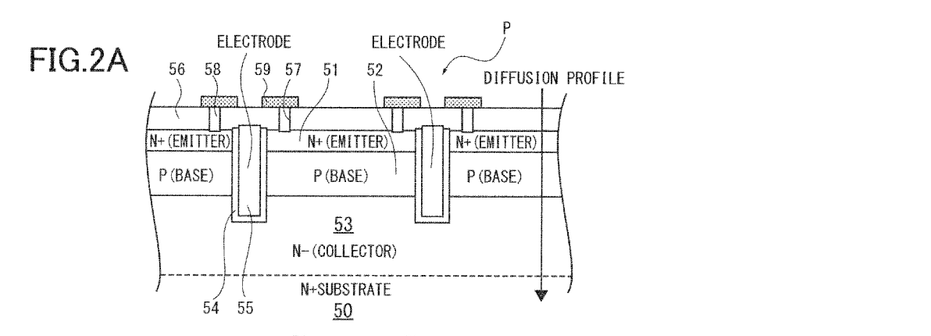
FIG. 2A is a sectional view of the phototransistor.
Figure 2B:
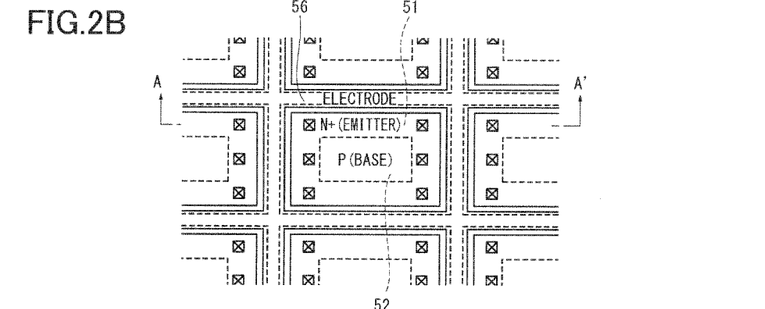
FIG. 2B is a plan view of the phototransistor.
Figure 2C:
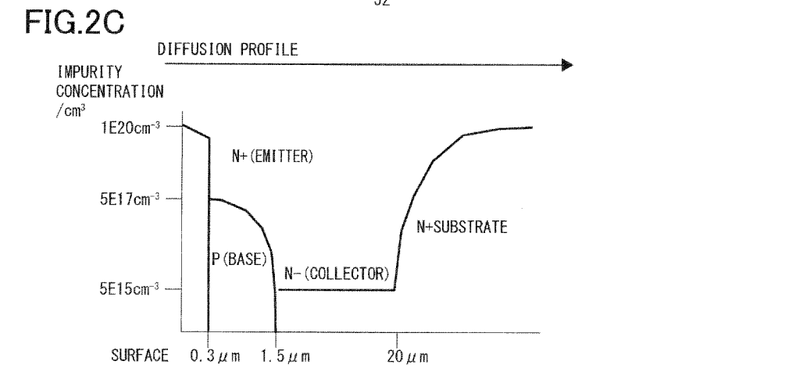
FIG. 2C is a graph illustrating a diffusion profile of an impurity region.
Figure 3:
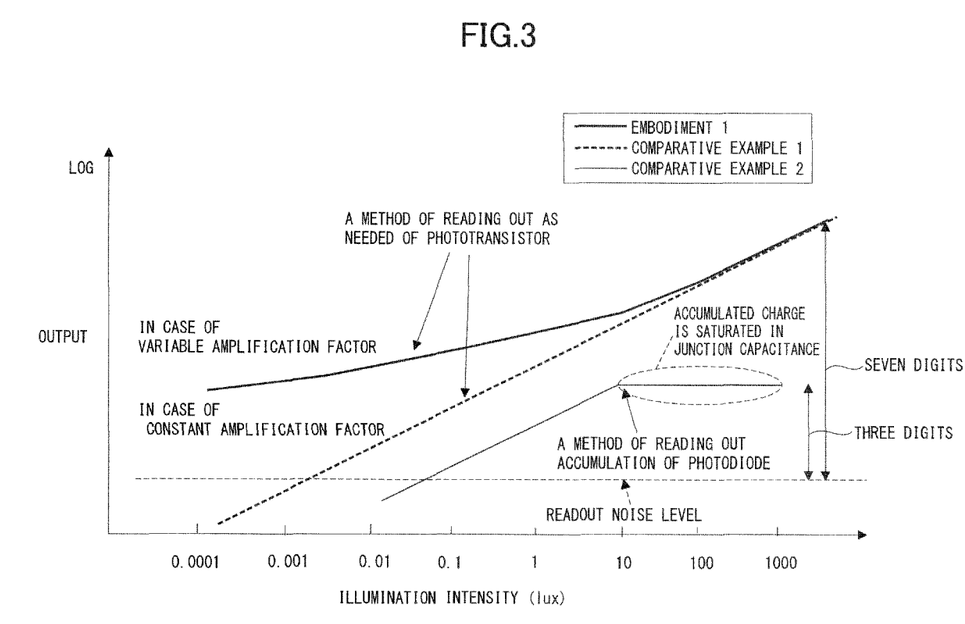
FIG. 3 is a graph illustrating characteristics of an amplification factor-variable phototransistor with an as-needed readout method as illustrated in FIGS. 2A to 2C, an amplification factor-constant phototransistor with an as-needed readout method as Comparative Example 1, and a photodiode with a storage readout method as Comparative Example 2.
Figure 4:
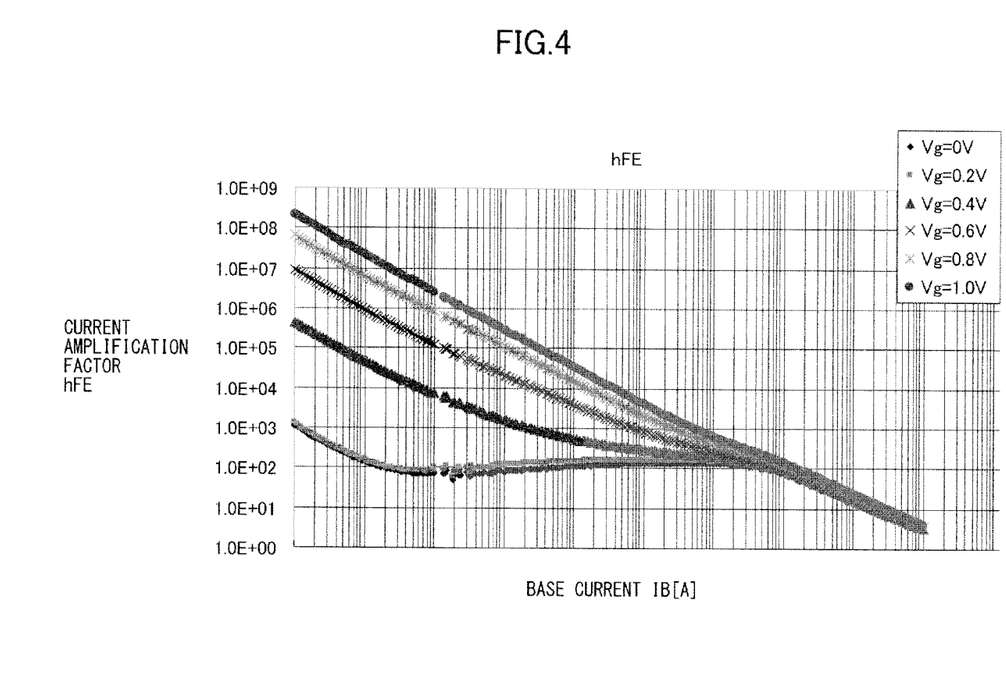
FIG. 4 is a graph illustrating an electric characteristic of the phototransistor illustrated in FIGS. 2A to 2C.
Figure 5:
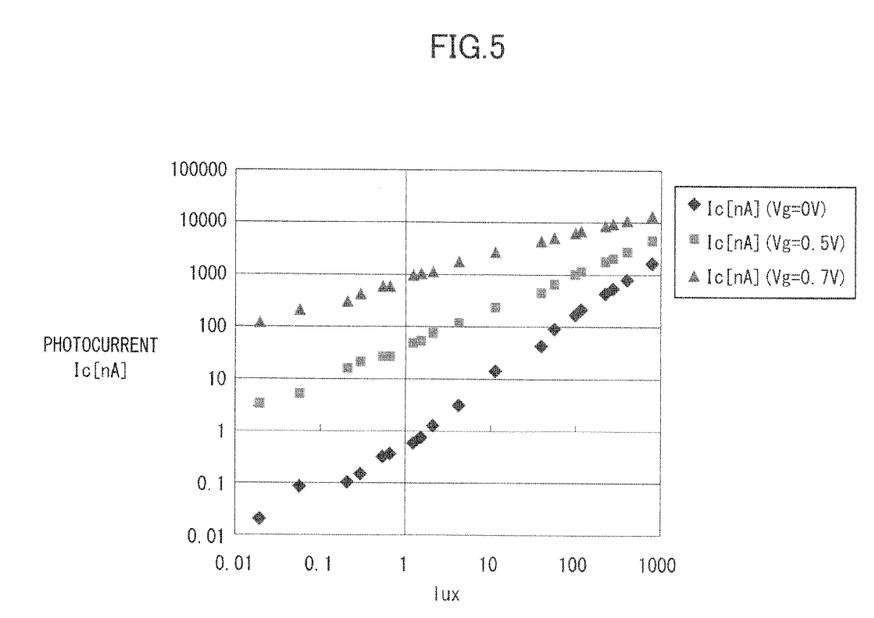
FIG. 5 is a graph illustrating an optical characteristic of the phototransistor illustrated in FIGS. 2A to 2C.

One example of the current amplification factor-variable phototransistor P will be hereinafter described with reference to FIGS. 2A to 2C. The characteristics of the phototransistor P will be described with reference to FIGS. 3, 4, 5. FIG. 2A is a sectional view of the phototransistor P, more specifically, an A-A' line sectional view of FIG. 2B. FIG. 2B is a plan view of the phototransistor P. FIG. 2C is a graph illustrating a diffusion profile of an impurity region of the phototransistor P. The phototransistor P illustrated in FIGS. 2A to 2C can be used as the phototransistor P (P1, P2, P3) of Embodiment 1. FIG. 3 is a graph illustrating characteristics of the current amplification factor-variable phototransistor P illustrated in FIGS. 2A to 2C, a current amplification factor-constant phototransistor in Comparative Example 1, and a photodiode in Comparative Example 2. FIGS. 4, 5 are graphs illustrating electric characteristics and optical characteristics of the phototransistor P in Embodiment 1.

FIG. 2A illustrates one example of the current amplification factor-variable phototransistor P. The phototransistor P illustrated in FIG. 2A includes a silicon substrate 50, and an electrode 55 embedded and insulated by an oxide film 54 from the surface to the inside of the substrate 50 (hereinafter referred to as an embedded electrode). The substrate 50 includes, in order from the surface along the embedded electrode 55, an emitter region 51 as a first conductive type first impurity region, a base region 52 as a second conductive type second impurity region, and a collector region 53 as a first conductive type third impurity region, and constitutes the phototransistor P with a vertical bipolar structure. The embedded electrode 55 reaches the collector region 53 through the emitter region 51 and the base region 52, and has contact with the emitter region 51, base region 52, and collector region 53 through the oxide film 54. The phototransistor P includes an interlayer insulating film 56 formed on the surface of the emitter region 51, a contact hole 57 formed in the interlayer insulating film 56, a plug 58 embedded in the contact hole 57, and a metal wiring 59.

As illustrated in FIG. 2B, a plurality of the above-described phototransistors P is two-dimensionally arrayed in a matrix. The arrayed phototransistors P have the common collector region 53, and obtain the photocurrent from the emitter region 51 side. The electrode 55 has a configuration which separates the emitter region 51 and the base region 52. The size of the phototransistor P is determined based on a size of an area separated by the electrode 55. For this reason, it is not necessary to consider a distance of the base region 52 in a lateral direction. The size of the phototransistor P can be therefore reduced. As a result, the image sensor 1 can be downsized.

More specifically, in the case where pixels are arrayed, for example, comparison with a diffusion-type bipolar which is formed just below the oxide film is considered. In this diffusion-type bipolar, when the depth of the base region is set to 1.5 μm, for example, the base region extends about 1.2 μm in a lateral direction. For this reason, it is necessary to ensure the collector region between the adjacent base regions, and about a 4-μm distance is required between pixels. On the other hand, the embedded electrode 55 of the phototransistor P in FIG. 2A can be embedded by forming a groove of about 5 μm in depth and 1 μm in width with a trench etching technique, and depositing polysilicon with a CVC device. The distance between the pixels 10 is therefore determined based on the width of the groove, and the size of the pixels 10 can be significantly reduced because it is not necessary to consider the width of the diffusion of the base region 52 in a lateral direction.

The embedded electrode 55, the emitter region (first impurity region) 51, and the base region (second impurity region) 52 are insulated and separated by the electric insulation oxide film (15 nm in thickness in phototransistor P in FIG. 2A) 54. The embedded electrode 55 is made of N-type polysilicon having an impurity concentration of $10^{20}$ cm$^{-3}$ or more, and is formed in low resistance. The emitter region 51 (N+), the base region 52 (P), and the collector region 53 (N−), which have contact with the embedded electrode 55 through the oxide film 54, have a vertical bipolar structure.

In general, the bipolar transistor has a concentration gradient such that the base region has an impurity concentration from a high impurity concentration to a low impurity concentration from the emitter region side to the collector region side. By setting the concentration gradient to the impurity concentration distribution as described above, the frequency characteristic is improved by the inside electric field in the base region, and the current amplification factor can be improved. The phototransistor P of FIG. 2A is formed such that the impurity concentration of the emitter region 51 is the highest, the impurity concentration of the base region 52 is lower than that of the emitter region 51, and the impurity concentration of the collector region 53 is smaller than that of the base region 52. The base region 52 is formed with a concentration gradient in which the impurity concentration is gradually lowered from the emitter region 51 side to the collector region 53 side.

The detailed description will be given with reference to FIG. 2C. In the example of the phototransistor P, the impurity concentration of the emitter region 51 is, for example, $10^{20}$ cm$^{-3}$. The phototransistor P has a concentration gradient such that the impurity concentration of the base region 52 is $5 \times 10^{17}$ cm$^{-3}$ just below the emitter region 51, and the impurity concentration of the base region 52 is $5 \times 10^{15}$ cm$^{-3}$ on the collector region 53 side. By changing the gate voltage from the voltage source Vcc to be applied to the embedded electrode 55, the region near the embedded electrode 55, which constitutes the phototransistor P is influenced by an electric field. The width of the base region 52 in a depth direction, which is a quasi-neutrality region, is particularly changed. As a result, the current amplification factor of the bipolar phototransistor P can be varied. For example, when the intensity of the light energy is small, and the photocurrent to be obtained is small, the gate voltage which increases the current amplification factor is applied to the embedded electrode 55, and the sensitivity can be improved relative to the intensity of the light energy by increasing the photocurrent to be output. On the other hand, when the intensity of the light energy is increased, and the photocurrent to be obtained is increased, the gate voltage which reduces the current amplification factor is applied to the embedded electrode 55. The sensitivity relative to the intensity of the light energy is thereby lowered, so that the saturation of the output current is prevented, and appropriate photocurrent according to light intensity can be obtained.

The phototransistor P has a concentration gradient such that the impurity concentration distribution in the base region 52 is a high impurity concentration on the emitter region 51 side, and is a low impurity concentration on the collector region 53 side. With this configuration, by applying the gate voltage to the embedded electrode 55, a depletion layer generated in the base region 52 on the collector region 53 side easily extends to the inside from the neighborhood of the embedded electrode 55, and a variation in current amplification factor can be increased compared to a uniform impurity concentration distribution.

The region where the current amplification factor varies is a region adjacent to the embedded electrode 55 in the example of the phototransistor P of FIG. 2A. The embedded electrode 55 exists over the entire length of the circumference of the pixel 10 as described above. By reducing the area of the pixel 10, the ratio of the area rate of the vertical bipolar adjacent to the embedded electrode 55 can be increased. The range of the current range which can vary the current amplification factor can be extended on the high current side.

Many phototransistors P zoned by the embedded electrode 55 are two-dimensionally arrayed, and are used as a single large area phototransistor having the common emitter region 51 and collector region 53. With this configuration, the effect similar to the above can be obtained by the large area phototransistor P.

In this case, the electric characteristic of the conventional photodiode and the electric characteristic of the phototransistor P of FIG. 2A are compared. In an image sensor, a photodiode is generally used, and gate voltage of a MOS transistor is controlled by photocurrent to output the voltage with a source follower voltage conversion method. The phototransistor P of FIG. 2A differs from the conventional photodiode in that it has an amplification operation, and it has an emitter follower configuration to treat current. When the area of the phototransistor and the area of the photodiode are the same, the photocurrent to be obtained by the phototransistor is increased based on the amplification factor compared to the photodiode. Moreover, the amplification factor of the photocurrent with the phototransistor has a characteristic which can be varied different from the photodiode.

FIG. 3 schematically illustrates the output characteristics of the photocurrent of the current amplification factor-variable phototransistor P (Embodiment 1 in FIG. 3) of FIG. 2A, a current amplification factor-constant phototransistor as Comparative Example 1, and a photodiode with a storage readout method as Comparative Example 2. The phototransistor of Comparative Example 1 is a bipolar phototransistor which amplifies photocurrent by applying bias voltage to the joined surface of the emitter region, base region, and collector region without having a gate electrode. In this case, when the current amplification factor is variable, a characteristic in which the current amplification factor is increased in a low illumination region, and is not increased in a high illumination region is preferable. Such a characteristic is similar to the human eye. For example, in the case of a phototransistor in which the amplification factor is constant relative to light intensity (illumination intensity) as Comparative Example 1, as illustrated in FIG. 3, a line shape characteristic is obtained. Compared to the photodiode of Comparative Example 2, the phototransistor of Comparative Example 1 can obtain the output of large signal charge by the amplification factor. Compared to Comparative Example 2, in Comparative Example 1, the output of the signal charge in a low illumination region is large, resulting in an increase in sensitivity.

On the other hand, in the photodiode in Comparative Example 2, signal charge to be obtained is increased by accumulating charge in a junction capacitance. However, in the junction capacitance, the accumulation capacitance of the charge is determined based on the joined area, the accumulated charge is saturated as surrounded by the dotted line in FIG. 3, and sensitivity relative to the light energy may be lowered, resulting in narrowing a dynamic range. The A/D convertor using the signal charge (output signal) to be output can use only a gradation of about 3 to 4 digits. For this reason, an area to be used is limited although the photodiode has a characteristic without the saturation of the accumulated charge as a phototransistor.

On the other hand, the phototransistor P of FIG. 2A not only includes an amplification operation of photocurrent, but also varies an amplification factor to the intensity of the light energy. In such a phototransistor P, the output signal is compressed to the output of 3 to 4 digits relative to 7 digits of the intensity of the light energy, and the usage in the A/D convertor can be simplified. For this reason, a complex circuit is not required, and a wide dynamic range characteristic can be achieved. By reading out the signal charge as needed with the amplification factor-variable phototransistor P of FIG. 2A, an image sensor including high sensitivity and a wide dynamic range characteristic can be achieved.

The characteristic of such a phototransistor P illustrated in FIG. 2A will be described in detail with reference to FIGS. 4, 5. FIG. 4 is a graph illustrating an electric characteristic of the phototransistor P of FIG. 2A, and illustrates a current amplification factor hFE relative to base current IP when the gate voltage is changed between Vg=0.0 V to 1.0 V. FIG. 5 is a graph illustrating the optical characteristic of the phototransistor P of FIG. 2A, and illustrates a change in photocurrent (collector current Ic) relative to the illumination intensity (lux) of the input light. As illustrated in FIG. 4, in the phototransistor P of FIG. 2A, the current amplification factor hFE varies with a logarithmic scale. Moreover, as illustrated in FIG. 5, in the phototransistor P of FIG. 2A, the output signal of the photocurrent is compressed to the output of 3 to 4 digits with a powering property by the gate voltage, relative to wide range illumination intensity.

In the image sensor, while relying on the characteristic of the phototransistor P, a method of processing a signal by reading out as needed photocurrent output from the phototransistor P while receiving light with the phototransistor P is adopted. The dynamic range can be thereby expanded without accumulating the signal charge inside the image sensor. In addition, the present invention is not limited to the configuration of the phototransistor P in FIG. 2A. Another type of a phototransistor which converts the light energy into signal charge and varies an amplification factor relative to the intensity of the received light energy may be used, so that high sensitivity and a wide dynamic range can be achieved.

As described above, in the image sensor 1 of Embodiment 1, the amplification factor can be varied in accordance with the intensity of the light energy by using the phototransistor P which amplifies photocurrent to be output, so that high sensitivity and a wide dynamic range can be achieved. When the signal charge is read out from the phototransistor P, a method of reading out as needed the signal charge output from the phototransistor P while receiving light with the phototransistor P without accumulating the signal charge in the junction capacitance, and processing the signal charge is adopted. The output signal can be therefore increased, the saturation of the accumulated charge inside the image sensor 1 can be prevented, and it becomes unnecessary to increase a capacitance. A synthesizing process of the image data becomes unnecessary by using the current amplification factor-variable phototransistor without using a method of accumulating electric charge. As described above, high sensitivity and a wide dynamic range can be achieved with a simple circuit, and the compact image sensor 1 can be achieved without increasing the size thereof.

In Embodiment 1, before reading out the signal charge from the phototransistor P, the signal charge accumulated in the phototransistor P is discharged by the reset switch R. By this discharge, the accumulation of the signal charge inside the image sensor 1 is controlled, and the control effect of the saturation of the accumulated charge can be improved by reading out the amplified photocurrent for each pixel 10. High sensitivity and a wider dynamic range characteristic can be therefore achieved without lowering the sensitivity relative to the light energy.

In Embodiment 1, the signal charge read out from each pixel 10 is integrated by the integration amplifier 20, and the integrated signal charge is converted into voltage generating within the readout time to be output. The photocurrent generated and output as needed from the phototransistor P of each pixel 10 has a relatively large variation. However, by accumulating the signal charge and converting the signal charge into the voltage by the integration amplifier 20 during the readout of the photocurrent, stable output can be achieved. Moreover, after outputting the signal charge in the integration amplifier 20, the signal charge accumulated in the capacitor 23 of the integration amplifier 20 is discharged by the integration amplifier reset switch B1. By discharging (resetting) the remaining charge of the integration amplifier 20 as described above, the saturation of the accumulated charge in the integration amplifier 20 can be prevented, and the stability when outputting the signal charge after that can be further improved.

The image sensor is widely used for a digital camera, camera-equipped cell-phone, scanner, and the like along with an improvement in characteristic thereof. A further improvement in characteristic of such an image sensor is desired, and expansion of a dynamic range is one of the desires. The dynamic range of the conventionally used image sensor is about 3 to 4 digits (60 to 80 dB), and a high quality image sensor having a dynamic range of 5 to 6 digits (100 to 120 dB) or more equivalent to the naked eye or a silver film is desired.

However, when the accumulation method as the conventional technique described in Patent Literatures 1, 2 is used, in the case of a wide dynamic range, the amount of electric charge generated when a light intensity is strong and/or an accumulation time is long is increased. For this reason, the accumulated charge to the capacitance of the photoelectric conversion element may be saturated. In order to solve such saturation, it is necessary to increase the capacitance, and it is also necessary to increase the area of the photoelectric conversion element or to prepare the capacitance which accumulates in another place for each pixel. The size of the imaging device is increased. On the other hand, in Embodiment 1, such a problem can be solved, and the high quality image sensor 1 having a wide dynamic range can be achieved.

(Embodiment 2)

Figure 7:
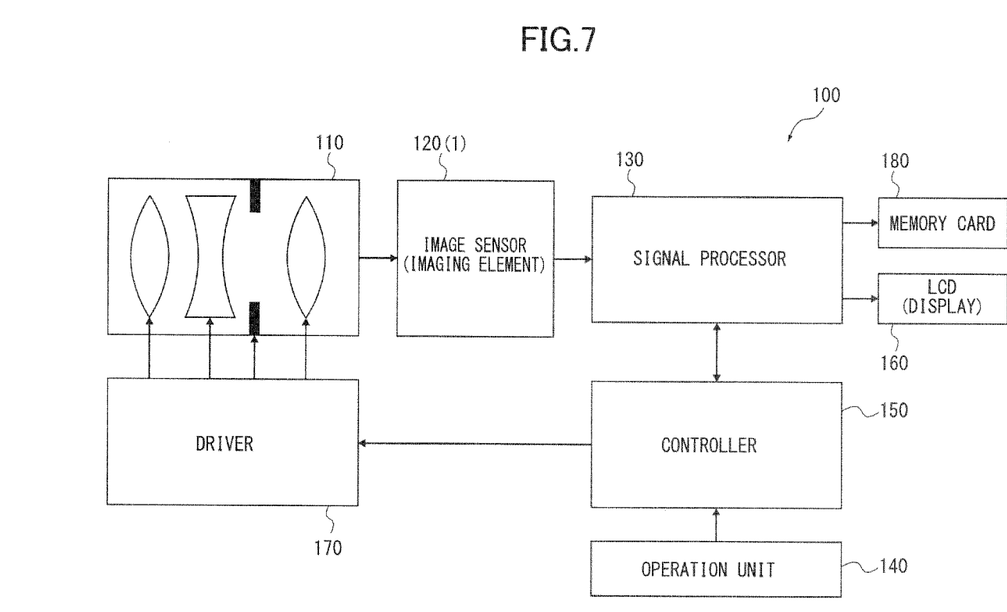
FIG. 7 is a block diagram illustrating a system configuration of a camera according to Embodiment 2 of the present invention.

Next, in Embodiment 2, one example of a camera including the imaging device of the present invention (for example, digital still camera or digital video camera) will be described with reference to FIG. 7. FIG. 7 is a block diagram illustrating the system configuration of a camera 100 of Embodiment 2. As illustrated in FIG. 7, the camera 100 of Embodiment 2 includes a photographing lens 110 as an imaging optical system, an image sensor 120 as an imaging element (imaging device of present invention), a signal processor 130, an operation unit 140, a controller (CPU) 150, a liquid crystal monitor (LCD) 160 as a display, a driver 170, and a memory card 180. The camera 100 includes a monitoring camera which is fixed in an outside, and continuously photographs a moving picture in addition to a digital camera and a video camera which photograph a still image and a moving picture.

The imaging lens 110 as the imaging optical system includes a plurality of lens groups such as a zoom lens group, focus lens group, and the like, and an aperture stop unit. The image sensor 120 as the imaging element images a subject optical image through the photographing lens 110 on a light-receiving surface, and converts the subject optical image into an electric image signal (digital signal) to be output. For example, the image sensor 1 of Embodiment 1 can be used as the image sensor 120. The signal processor 130 loads the image signal output from the image sensor 120 by processing (digital process) the image signal, and converts the signal into the displayable and recordable image data. The operation unit 140 inputs the operation information for operating the camera 100. The operation unit 140 includes a power source button, release button, photographing mode-switching button provided in the camera 100. In the case of a monitoring camera, or the like, the operation unit 100 may be provided in the main body of the camera 100, or operation information may be input to the camera 100 by using a mouse and/or a keyboard (not shown) of a personal computer (PC) connected to the camera 100 as the operation unit 140.

The controller (CPU) 150 controls the entire system of the camera 100 by executing a control program stored in a not-shown ROM based on the operation information input from the operation unit 140. The liquid crystal monitor (LCD) 160 as a display displays image data generated in the signal processor 130. The liquid crystal monitor 160 includes a monitor provided in the main body of the camera 100 and a monitor provided in a PC to which the camera 100 is connected. The driver 170 drives the focus lens group, zoom lens group, shutter unit, and the like of the photographing lens 110. The memory card 180 records image data generated in the signal processor 130.

The operation in the above-described camera 100 will be described. The photographing is started by operating the power source button and/or the photographing mode-switching button of the operation unit 140. In this case, the photographing image (moving picture) is displayed on the liquid crystal monitor 160 by the monitoring operation of the camera 100. A photographer performs photographing while viewing the photographing image displayed on the camera 100 and/or the liquid crystal monitor 160. The photographing of a still image and/or the photographing of a moving picture is started in response to the operation of the release button or the like of the operation unit 140 by a photographer. The subject image from the photographing lens 110 is imaged on a light-receiving surface of the image sensor 120, and the light energy received by each pixel 10 in FIG. 1 is converted into signal charge by the phototransistor P.

The amplified signal charge can be read out by reading out as needed the converted signal charge while receiving the light energy with the phototransistor P without accumulating the signal charge in the phototransistor P. The detour process using the reset switch R is executed before reading out the signal charge from the phototransistor P for each frame of a moving picture or each still image to be imaged. The signal charge accumulated in the phototransistor P detours the output line 2, and is discharged through the reset line 3 by the detour process. Moreover, following the detour process, the signal charge read out while receiving the light energy with the phototransistor P is integrated (accumulated) by the integration amplifier 20 illustrated in FIG. 1, and is converted into the digital signal by a not-shown A/D convertor to be output. The digital signal output from the image sensor 120 is loaded by the signal processor 130 to be digitized, and is converted into displayable and recordable image data. The image data generated in the signal processor 130 is controlled by the controller 150, is displayed on the liquid crystal monitor 160, and is recorded in the memory card 180.

As described above, in the camera 100 of Embodiment 2, a method of reading out as needed signal charge while receiving light energy is adopted by using the image sensor 120 (1) of Embodiment 1. The saturation of the signal charge in the image sensor 120 can be thereby controlled. The synthesizing process of the image data becomes unnecessary, and the complex circuit can be controlled. High sensitivity and a wide dynamic range of the image sensor 120 can be achieved with a simple circuit. The compact camera 100 without increasing in size can be achieved with a simple circuit. High sensitivity and a wide dynamic range can be achieved over a wide region from a low illumination intensity side to a high illumination intensity side. Thus, the imaging device of the present invention can be preferably used for a monitoring camera which continuously photographs a moving picture from night time in which light energy is weak to daytime in which light energy is strong.

In Embodiment 2, the imaging device is applied to a digital still camera, a digital video camera, and the like. However, the present invention is not limited to Embodiment 2. The present invention may be applied to an electric device such as a camera-equipped cell-phone, camera-equipped personal digital assistance (PDA), and the like, or an electric device such as an image forming apparatus, for example, a scanner, facsimile, and multifunction peripheral (MFP) which read an original. In any case, high sensitivity and a wide dynamic range can be achieved with a simple circuit by reading out the signal charge while receiving the light energy with the current amplification factor-variable phototransistor. A compact electric device can be obtained without increasing a size.

Figure 8:
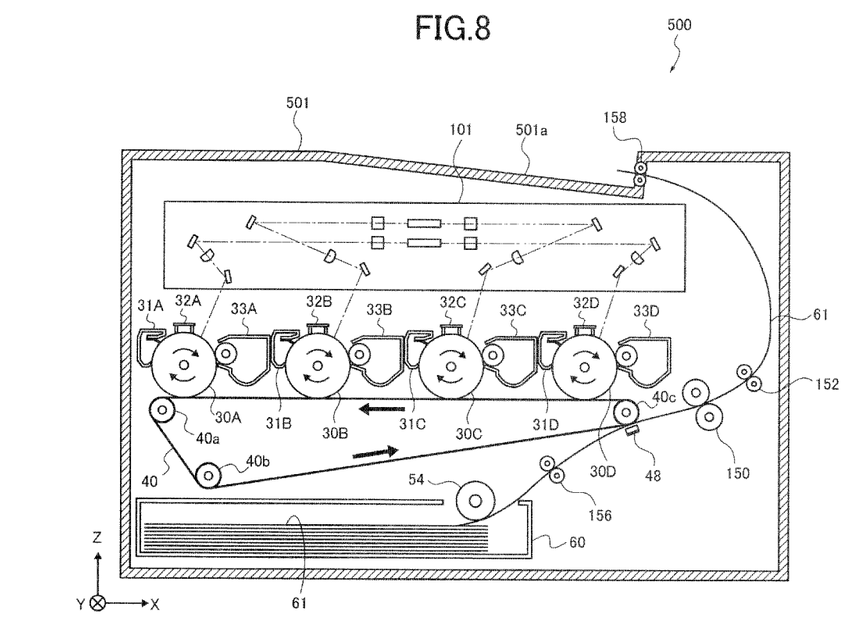
FIG. 8 is an example of an image-forming apparatus according to one embodiment of the present invention.

The imaging device of the present invention may be applied to a multifunction peripheral (MFP). FIG. 8 provides an example of an image-forming apparatus 500.

The image-forming apparatus 500 is, for example, a tandem type color printer which prints multi-color images by superimposing and transferring black, yellow, magenta, and cyan color toner images onto sheets of paper. The image-forming apparatus 500 as shown in FIG. 8 comprises an optical scan apparatus 101, four photoconductive drums 30A to 30D, a transfer belt 40, a paper feed tray 60, a paper feed roller 154, a first resist roller 156, a second resist roller 152, a fuse roller 150, a paper discharge roller 158, a not-shown controller collectively controlling the respective components, and a housing 501 in a rectangular solid shape accommodating the components.

A paper discharge tray 501*a* on which printed sheets are discharged is formed on the top surface of the housing 501. The optical scan apparatus 101 is disposed under the paper discharge tray 501*a*.

The optical scan apparatus 101 scans the photoconductive drum 30A with a light beam for black image components modulated by image information supplied from a higher-level device (such as personal computer). Similarly, it scans the photoconductive drum 30B with a light beam for cyan image components, the photoconductive drum 30C with a light beam for magenta image components, and the photoconductive drum 30D with a light beam for yellow image components.

The four photoconductive drums 30A to 30D are cylindrical members and have photoconductive layers on their surfaces which become electrically conductive when illuminated with a light beam. They are disposed with an equal interval in an X-axis direction under the optical scan apparatus 101 in FIG. 8.

The photoconductive drum 30A is disposed at an end portion of a reverse X-axis direction (left side in FIG. 8) inside the housing 501 so that its longitudinal direction is to be the Y-axis direction. The photoconductive drum 30A is rotated by a not-shown rotation mechanism clockwise (as indicated by black arrows in FIG. 8). An electric charger 32A at the 12 o'clock position (upper side), a toner cartridge 33A at 2 o'clock position and a cleaning case 31A at the 10 o'clock position are disposed around the photoconductive drum 30A.

The electric charger 32A is disposed with a predetermined clearance over the surface of the photoconductive drum 30A with its longitudinal direction as the Y-axis direction. It electrically charges the surface of the photoconductive drum 30A with a predetermined voltage.

The toner cartridge 33A includes a cartridge body containing a toner of black image components and a developing roller charged with a voltage of reverse polarity of that of the photoconductive drum 30A, and the like. The toner cartridge 33A supplies the toner in the cartridge body to the surface of the photoconductive drum 30A via the developing roller.

The cleaning case 31A is provided with a cleaning blade of a rectangular shape with its longitudinal direction as the Y-axis direction, and it is disposed so that one end of the cleaning blade comes in contact with the surface of the photoconductive drum 30A. The toner adhering on the surface of the photoconductive drum 30A is removed by the cleaning blade along with the rotation of the photoconductive drum 30A and collected in the cleaning case 31A.

The photoconductive drums 30B, 30C, 30D with the same structure as that of the photoconductive drum 30A are placed in sequence on the right side of the photoconductive drum 30A with a predetermined interval. They are rotated by a not-shown rotation mechanism clockwise (as indicated by the black arrows in FIG. 8). Similarly to the photoconductive drum 30A, electric chargers 32B, 32C, 32D, toner cartridges 33B. 33C, 33D, and cleaning cases 31B, 31C, 31D are disposed around the photoconductive drums 30B, 30C, 30D, respectively.

The electric chargers 32B, 32C, 32D with the same structure as that of the electric charger 32A are disposed to electrically charge the surfaces of the photoconductive drums 30B, 30C, 30D with a predetermined voltage, respectively.

The toner cartridges 33B, 33C, 33D include cartridge bodies containing toners of cyan, magenta, yellow image components and developing rollers charged with a voltage of reverse polarity of that of the photoconductive drums 30B, 30C, 30D, and the like, respectively. The toner cartridges 33B, 33C, 33D supply the toners in the cartridge bodies to the surfaces of the photoconductive drums 30B, 30C, 30D via the developing rollers, respectively.

The structure and function of the cleaning cases 31B, 31C, 31D are the same as those of the cleaning case 31A.

Hereinafter, a unit of the photoconductive drum 30A, the electric charger 32A, the toner cartridge 33A, and the cleaning case 31A is to be referred to as the first image-forming station; likewise, a unit of the photoconductive drum 30B, the electric charger 32B, the toner cartridge 33B, and the cleaning case 31B as the second image-forming station, a unit of the photoconductive drum 30C, the electric charger 32C, the toner cartridge 33C, and the cleaning case 31C as the third image-forming station, and a unit of the photoconductive drum 30D, the electric charger 32D, the toner cartridge 33D, and the cleaning case 31D as the fourth image-forming station.

The transfer belt 40 is a free end ring-like member and rolls over driven rollers 40a, 40c placed under the photoconductive drums 30A, 30D, respectively, and rolls over a drive roller 40b which is placed at a slightly lower position than the driven rollers 40a, 40c. The upper end surface of the transfer belt 40 is in contact with the lower end surfaces of the photoconductive drums 30A, 30B, 30C, 30D. The transfer belt 40 is rotated counterclockwise (as indicated by the black arrows in FIG. 8) by counterclockwise rotation of the drive roller 40b. A transfer charger (transfer unit) 48 is applied with a voltage of a reverse polarity of that of the electric chargers 32A, 32B, 32C, 32D and is placed close to one end of the transfer belt 40 in the X-axis direction (right side in FIG. 8).

The paper feed tray 60 of a substantially rectangular solid shape is placed under the transfer belt 40 and contains stacked-up paper sheets 61 for printing. The paper feed tray 60 has a feeder outlet of a rectangular shape close to one end of the upper surface thereof in the X-axis direction (right side in FIG. 8).

The paper feed roller 154 extracts paper sheets one by one from the paper feed tray 60 to feed them to a gap formed between the transfer belt 40 and the transfer charger 48 via the first resist roller 156 composed of a pair of rotary rollers.

The fuse roller 150 is composed of a pair of rotary rollers, and applies heat and pressure to the paper sheets 61 to feed the paper sheets 61 to the discharge roller 158 via the resist roller 152 composed of a pair of rotary rollers. The discharge roller 158 is composed of a pair of rotary rollers and discharges the paper sheets 61 to the discharge tray 501a.

According to the embodiments of the present invention, the imaging device and the method of driving the imaging device having high sensitivity and a wide dynamic range can be obtained with a simple circuit without increasing the size of the imaging device.

Although the embodiments of the present invention have been described above, the present invention is not limited thereto. It should be appreciated that variations may be made in the embodiments described by persons skilled in the art without departing from the scope of the present invention.

What is claimed is:

1. An imaging device comprising at least one pixel including a phototransistor which converts light energy into signal charge, amplifies the signal charge by an amplification factor, and varies the amplification factor relative to the intensity of the received light energy, wherein the amplified signal charge of the phototransistor is read out from each pixel amongst the at least one pixel while the phototransistor receives the light energy, wherein the phototransistor includes a substrate and an embedded electrode insulated by an oxide film from a surface to an inside of the substrate, the substrate includes, in order from the surface side along the electrode, a first conductivity type first impurity region, a second conductivity type second impurity region having a concentration lower than that of the first conductivity type first impurity region, and a first conductivity type third impurity region having a concentration lower than that of the second conductivity type second impurity region, the second impurity region includes a concentration gradient such that an impurity concentration is gradually lowered from the first impurity region side to the third impurity region side, the electrode has contact with the first impurity region, the second impurity region, and the third impurity region through the oxide film, and the phototransistor varies the amplification factor of the signal charge by applying voltage to the electrode.

2. The imaging device according to claim 1, further comprising:

a detour switch which guides the signal charge accumulated in the phototransistor to an alternative path separated from a readout path of the signal charge, wherein the signal charge accumulated in the phototransistor detours the readout path to be guided to the alternative path by the detour switch before reading out the signal charge from the phototransistor.

3. The imaging device according to claim 2, wherein the pixel includes a first switch which reads out the signal charge of the phototransistor to be guided to the readout path, and a second switch as the detour switch which guides the signal charge to the alternative path, and after the signal charge of the phototransistor detours the readout path to be guided to the alternative path by turning off the first switch and turning on the second switch, the signal charge of the phototransistor is read out while receiving the light energy with the phototransistor by turning off the second switch and turning on the first switch.

4. The imaging device according to claim 1, wherein a plurality of pixels are arrayed.

5. The imaging device according to claim 1, further comprising:

an integration amplifier including an operational amplifier, a resistor, and a capacitor, wherein the signal charge of the phototransistor is read out by the integration amplifier.

6. The imaging device according to claim 5, further comprising:

an integration amplifier capacitance reset unit which discharges the signal charge accumulated in the capacitor of the integration amplifier, wherein the signal charge accumulated in the capacitor is discharged by the integration amplifier capacitance reset unit after reading out the signal charge of the phototransistor by the integration amplifier.

7. A method of driving an imaging device including at least one pixel having a phototransistor which receives light energy to be converted into signal charge, comprising:

a light-receiving step of receiving the light energy with the phototransistor, converting the light energy into signal charge, amplifying the signal charge by an amplification factor, and varying the amplification factor relative to the intensity of the received light energy; and a step of reading out the amplified signal charge of the phototransistor from each pixel amongst the at least one pixel while executing the light-receiving step, wherein the phototransistor includes a substrate and an embedded electrode insulated by an oxide film from a surface to an inside of the substrate, the substrate includes, in order from the surface side along the electrode, a first conductivity type first impurity region, a second conductivity type second impurity region having a concentration lower than that of the first conductivity type first impurity region, and a first conductivity type third impurity region having a concentration lower than that of the second conductivity type second impurity region, the second impurity region includes a concentration gradient such that an impurity concentration is gradually lowered from the first impurity region side to the third impurity region side, the electrode has contact with the first impurity region, the second impurity region, and the third impurity region through the oxide film, and the phototransistor varies the amplification factor of the signal charge by applying voltage to the electrode.

8. The method of driving an imaging device according to claim 7, further comprising:

a detour step of detouring the signal charge accumulated in the phototransistor, wherein after executing the detour step, the light-receiving step by the phototransistor is started, and the reading-out step is executed while executing the light-receiving step.

9. The method of driving an imaging device according to claim 7, further comprising:

a step of converting the signal charge of the phototransistor into voltage by accumulating the signal charge of the phototransistor read out for each pixel in the reading-out step by an integration amplifier including an operational amplifier, a resistor, and a capacitor.

10. The method of driving an imaging device according to claim 9, further comprising:

a step of discharging the signal charge accumulated in the capacitor after the step of converting the signal charge into the voltage by accumulating the signal charge by the integration amplifier.

11. A camera, comprising:

an imaging optical system;

an imaging element which converts a subject optical image imaged by the imaging optical system into an electric image signal;

a signal processor which process an image signal read out from the imaging element; and a display which displays image data output from the signal processor, wherein the imaging device according to claim 1 is used as the imaging element.

12. The imaging device according to claim 1, further comprising:

a detour switch which guides the signal charge accumulated in the phototransistor to an alternative path separated from a readout path of the signal charge, wherein the signal charge accumulated in the phototransistor detours the readout path to be guided to the alternative path by the detour switch before reading out the signal charge from the phototransistor.

13. The imaging device according to claim 1, further comprising:

a detour switch which guides the signal charge accumulated in the phototransistor to an alternative path separated from a readout path of the signal charge, wherein the signal charge accumulated in the phototransistor detours the readout path to be guided to the alternative path by the detour switch before reading out the signal charge from the phototransistor, the pixel includes a first switch which reads out the signal charge of the phototransistor to be guided to the readout path, and a second switch as the detour switch which guides the signal charge to the alternative path, after the signal charge of the phototransistor detours the readout path to be guided to the alternative path by turning off the first switch and turning on the second switch, the signal charge of the phototransistor is read out while receiving the light energy with the phototransistor by turning off the second switch and turning on the first switch.

14. The imaging device according to claim 1, further comprising:
a detour switch which guides the signal charge accumulated in the phototransistor to an alternative path separated from a readout path of the signal charge, and
an integration amplifier including an operational amplifier, a resistor, and a capacitor, wherein
the signal charge of the phototransistor is read out by the integration amplifier, and
the signal charge accumulated in the phototransistor detours the readout path to be guided to the alternative path by the detour switch before reading out the signal charge from the phototransistor.

15. The imaging device according to claim 1, further comprising:
a detour switch which guides the signal charge accumulated in the phototransistor to an alternative path separated from a readout path of the signal charge; and
an integration amplifier including an operational amplifier, a resistor, and a capacitor, wherein
the signal charge of the phototransistor is read out by the integration amplifier,
the signal charge accumulated in the phototransistor detours the readout path to be guided to the alternative path by the detour switch before reading out the signal charge from the phototransistor,
the pixel includes a first switch which reads out the signal charge of the phototransistor to be guided to the readout path, and a second switch as the detour switch which guides the signal charge to the alternative path, and
after the signal charge of the phototransistor detours the readout path to be guided to the alternative path by turning off the first switch and turning on the second switch, the signal charge of the phototransistor is read out while receiving the light energy with the phototransistor by turning off the second switch and turning on the first switch.

16. The imaging device according to claim 1, further comprising:
a detour switch which guides the signal charge accumulated in the phototransistor to an alternative path separated from a readout path of the signal charge; and
an integration amplifier including an operational amplifier, a resistor, and a capacitor, wherein
the signal charge of the phototransistor is read out by the integration amplifier,
the signal charge accumulated in the phototransistor detours the readout path to be guided to the alternative path by the detour switch before reading out the signal charge from the phototransistor,
the pixel includes a first switch which reads out the signal charge of the phototransistor to be guided to the readout path, and a second switch as the detour switch which guides the signal charge to the alternative path,
after the signal charge of the phototransistor detours the readout path to be guided to the alternative path by turning off the first switch and turning on the second switch, the signal charge of the phototransistor is read out while receiving the light energy with the phototransistor by turning off the second switch and turning on the first switch.

17. The imaging device according to claim 1, further comprising:
a detour switch which guides the signal charge accumulated in the phototransistor to an alternative path separated from a readout path of the signal charge; and
an integration amplifier including an operational amplifier, a resistor, and a capacitor, wherein
the signal charge of the phototransistor is read out by the integration amplifier,
the signal charge accumulated in the phototransistor detours the readout path to be guided to the alternative path by the detour switch before reading out the signal charge from the phototransistor,
the pixel includes a first switch which reads out the signal charge of the phototransistor to be guided to the readout path, and a second switch as the detour switch which guides the signal charge to the alternative path,
after the signal charge of the phototransistor detours the readout path to be guided to the alternative path by turning off the first switch and turning on the second switch, the signal charge of the phototransistor is read out while receiving the light energy with the phototransistor by turning off the second switch and turning on the first switch,
and a plurality of pixels are arrayed.

18. The method of driving an imaging device according to claim 7, further comprising:
a detour step of detouring the signal charge accumulated in the phototransistor; and
a step of converting the signal charge of the phototransistor into voltage by accumulating the signal charge of the phototransistor read out for each pixel in the reading-out step by an integration amplifier including an operational amplifier, a resistor, and a capacitor, wherein
after executing the detour step, the light-receiving step by the phototransistor is started, and the reading-out step is executed while executing the light-receiving step.

* * * * *